United States Patent [19]

Pitt et al.

[11] 4,398,342
[45] Aug. 16, 1983

[54] METHOD OF MAKING A HALL EFFECT DEVICE

[75] Inventors: Gillies D. Pitt, Saffron Walden; Peter D. Greene, Harlow; Edward J. Thrush, Stansted Mountfitchet; David H. Whysall, Harlow, all of England

[73] Assignee: International Standard Electric Corporation, New York, N.Y.

[21] Appl. No.: 350,976

[22] Filed: Feb. 22, 1982

[30] Foreign Application Priority Data

Apr. 14, 1981 [GB] United Kingdom ............... 8111812

[51] Int. Cl.³ .......................................... H01L 43/04
[52] U.S. Cl. ..................................... 29/580; 29/588; 29/589; 323/368; 338/32 H; 357/27
[58] Field of Search ................... 29/580, 588, 589; 323/368; 338/32 H; 357/27, 4

[56] References Cited

U.S. PATENT DOCUMENTS 3,845,445 10/1974 Braun et al. ................... 338/32 H
4,021,767 5/1977 Nonaka et al. ................ 29/588 X

*Primary Examiner*—L. Dewayne Rutledge
*Assistant Examiner*—Alan E. Schiavelli
*Attorney, Agent, or Firm*—John T. O'Halloran; Robert E. Lee, Jr.

[57] ABSTRACT

A Hall effect device comprises a thin substrate free epitaxially grown semiconductor body mounted in a magnetically permeable, e.g. ferrite, housing. The layer, which is preferably gallium arsenide or gallium indium arsenide, is grown on a substrate which, after device processing is complete, is removed by a selective etching process. In view of the relatively high sensitivity and good noise characteristics such a device with its flux concentrator is small, since the flux concentrators are themselves much smaller than with conventional Hall effect systems. Other semiconductor materials from which the novel thin Hall effect devices can be made include silicon.

14 Claims, 9 Drawing Figures

METHOD OF MAKING A HALL EFFECT DEVICE

BACKGROUND OF THE INVENTION

This invention relates to semiconductor devices of the Hall effect type, to methods of fabricating such devices, and to applications thereof.

As is well known, a Hall effect device comprises a plate-like body of a semiconductor material through which a transverse magnetic field may be applied. The effect of the magnetic field is to deflect an electric current flowing across the body between a pair of current electrodes, this deflection of the current inducing a potential difference between a pair of sensor or Hall electrodes disposed one on each side of a line joining the two current electrodes. The magnitude of this Hall voltage $V_H$ is given approximately by the expression $$V_H = BI/nde$$

where B is the applied magnetic field intensity; I is the current through the device; n is the carrier concentration of the device material; e is the electronic charge and d is the device thickness. Thus, the output Hall voltage is inversely proportional to the device thickness and is directly porportional to the current, which in turn is a function of the carrier mobility in the semiconductor material.

Hall effect devices are used in a variety of applications, their most important features being the complete absence of moving parts and the provision of a high degree of isolation between the control input and the device output. These features have made the use of such devices in e.g. telephone switching applications an attractive proposition. The use of Hall effect devices is however limited at present by their relatively low sensitivity which in turn results in a relatively high power consumption.

From the expression given above, it will be seen that the sensitivity of a Hall effect device can be enhanced by using a semiconductor material having a relatively high carrier mobility, e.g. gallium arsenide, and at the same time reducing the device thickness to a minimum. However, previous attempts to produce thin wafers of gallium arsenide have not been successful.

U.S. Pat. Nos. 3,265,959; 3,943,481 and 4,021,767 relate to Hall-effect devices.

SUMMARY OF THE INVENTION

An object of the invention is to minimize or to overcome these disadvantages by providing a reduced thickness Hall-effect device.

According to the invention there is provided a method of fabricating a small, high-sensitivity Hall effect device assembly, including providing an epitaxial layer of a compound semiconductor on a substrate of the same semiconductor or a lattice-matching semiconductor, providing current contacts and Hall contacts to the exposed face of the epitaxial layer, removing the substrate from the unexposed face of the epitaxial layer and mounting the device in a space between the ends of two flux concentrator rods.

Reduction of the device thickness has the additional consequent effect of increasing the magnetic field through the device as the reduced thickness provides for a reduced air gap between the poles of the magnet used to operate the device. This renders the device useful in application in which high sensitivity is important, one such application being as a magnetometer.

BRIEF DESCRIPTION OF THE DRAWINGS

Embodiments of the invention will now be described with reference to the accompanying drawings in which.

DETAILED DESCRIPTION OF THE INVENTION

Figure 1:
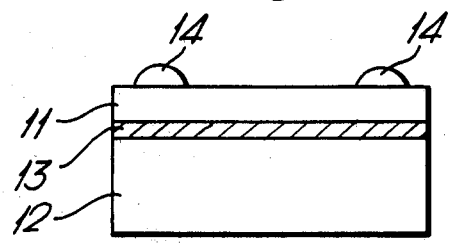
FIGS. 1 to 3 illustrate successive stages in the fabrication of a gallium arsenide Hall effect device.
Figure 2:
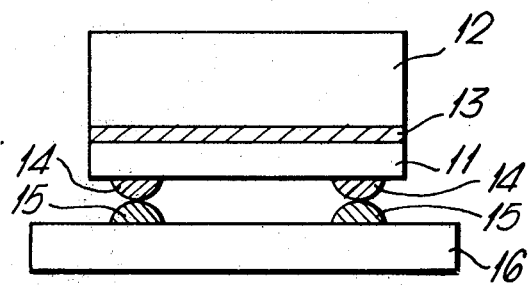
Figure 3:
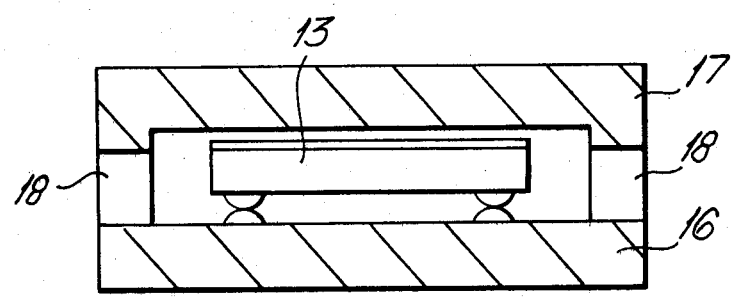

Referring to FIGS. 1 to 3, the Hall effect device is formed in an n-type gallium arsenide epitaxial layer 11 (FIG. 1) grown on a gallium arsenide semi-insulating substrate 12 by conventional liquid or vapor phase epitaxial techniques. Typically the epitaxial layer 11 is from 2 to 20 microns in thickness, and in some applications an intervening, e.g. 5 micron, layer 13 of gallium aluminum arsenide ($Ga_{1-x}Al_xAs$ where $0.8 > x > 0.5$) may be provided between the substrate 12 and the epitaxial layer 11. Where such an intervening alloy layer is provided the substrate need not be semi-insulating.

Hall-type ohmic contacts 14 of gold or a gold tin alloy providing low contact resistance are formed on the n-type epitaxial GaAs layer using standard photolithographic techniques. The assembly is next inverted (FIG. 2) on to a gold or gold-tin alloy contact pattern 15 laid on an insulating magnetic substrate 16 e.g. a ferrite, such that contact is made to the contacts 14.

The semi-insulating substrate layer 12 is back-etched using controlled etching techniques to provide uniformity of device thickness. The etch can either be a normal GaAs etch or one which preferentially etches GaAs with respect to GaAlAs. If the latter has been grown the etching stops at the alloy layer. This is known as a "chemi-stop" process. Then, see FIG. 3, a lid 17 of ferrite or other magnetic material is placed over the device, and the package is incorporated in a magnetic circuit. Alternatively the base or substrate can already be part of the magnetic circuit.

In FIG. 3, the substrate 16 and lid 17 are of magnetic material, as already mentioned, while the side wall 18 is of non-magnetic material. Typically the depth of the non-magnetic side walls is 10 microns, while the region 13 is in the range of 0.1 to 5 microns.

By employing the above technique the air gap can be reduced to less than 10 microns, i.e. the increase in output by a factor of approximately 50 over conventional gallium arsenide devices.

Various methods may be used for removing the substrate from the back of the device. One such method is the cathodic inhibition method as described in our British Patent specification No. 1,469,005. In this method the GaAs is grown on a semi-insulating (SI) GaAs substrate. A chemical etch e.g.

| KOH | H$_2$O$_2$ | H$_2$O |
|-----|------------|--------|
| 2 g | 10 ml (actually 10 ml of a standard commercial 30% solution) | 20 ml | is used to dissolve the GaAs substrate. The semiconductor is given a negative potential ($\sim$10 V) by an external power supply, which inhibits the action of the chemical etch. However this only affects the conductive epilayer. The surface of the high resistance material does not acquire the negative potential, so the substrate dissolves at the normal uninhibited rate. This is about 1 $\mu$m/min for the quoted mixture.

An alternative technique is the chemical discrimination method. This does not depend on the electrical properties of the substrate, whch can be n or p or SI, but requires the presence of the layer 13 of Ga$_{1-x}$Al$_x$As between the substrate and the GaAs epilayer. The substrate is removed using an etch which does not attack Ga$_{1-x}$Al$_x$As, wherein x>0.5. A mixture of 95% H$_2$O$_2$ solution (30% H$_2$O$_2$ in H$_2$O) with 5% concentrated NH$_3$ solution has the required properties. If necessary the barrier layer of Ga$_{1-x}$Al$_x$ can then be removed by dissolution in concentrated HF solution, which does not attach GaAs to any significant extent.

For both etching techniques the device uniformity is determined by the uniformity of the GaAs epilayer growth. The best uniformity has been achieved with the metalorganic chemical vapor deposition (MOCVD) process.

In a further embodiment a device can be produced by growing n-type gallium indium arsenide, typically Ga$_{0.47}$In$_{0.53}$As, on an indium arsenide, (InP) substrate, preferably of semi-insulating material, and then selectively removing the latter. The composition Ga$_{0.47}$In$_{0.53}$As gives the epitaxial layer the same lattice parameter as the InP substrate. An exact match is not essential but a close match should be provided. The gallium indium phosphide layer can be grown be conventional liquid epitaxial techniques.

The mobility at room temperature in Ga$_{0.47}$In$_{0.53}$As can be as high as 13,000 cm$^2$v$^{-1}$s$^{-1}$, which is significantly greater than in GaAs with up to 8,000 cm$^2$v$^{-1}$s$^{-1}$.

Chemically selective dissolution of the InP can be achieved using a mixture of hydrochloric acid (HCl) and phosphoric acid (H$_3$PO$_4$), typically in a volume ratio of 3:1, but other proportions would be satisfactory.

Other methods than those described above can be used to produce the thin Hall layer, including ion implantation and the MOCVD growth method.

The Hall effect devices described herein may be used in a variety of applications. In particular they may be used as switching elements in telecommunication exchanges, as general purpose relays or switches, or as current and magnetic field measuring devices. As will be seen from the subsequent description they can also be used in magnetometers.

Figure 4:
FIG. 4 shows how a Hall effect device embodying the invention can be used with flux concentration.

We have referred above to the use of Hall effect devices as the sensing elements of magnetometers; with the relatively large and insensitive Hall elements hitherto available this has necessitated the use of relatively large flux concentrators. With a Hall element 9 mm square and 0.2 mm thick, the flux concentrators may be rods each 200 mm long and 11 mm in diameter. Such flux concentrators are arranged as shown in FIG. 4, where 20 and 21 are flux concentrator rods with the Hall element in the air, as indicated at 21.

The use of the very small, back-etched, devices made as described above permits a substantial reduction in the size of the concentrators and the air gap. Thus if, by the method described above, we make a Hall element of thickness 10 $\mu$m and 0.5 mm square, the air gap can be 0.3 mm, but with flux concentrator rods only 20 mm long and 1.1 mm in diameter. The reduction of the air gap thus made possible means that the enhancement of the magnetic induction increases exponentially. This would give an increase in sensitivity of at least 300 times.

The back-etch method, however, enables even thinner Hall elements to be made, for instance to sub-millimeter size, in which case we can have a Hall element 0.5 mm square and 1 $\mu$m thick, on a 9 $\mu$m substrate. With this fitting closely between the flux concentrators we have an air gap of as little as 10 $\mu$m. Flux-concentrators for such an element can be 8 mm long and 0.5 mm in diameter. This will give an even greater enhancement of sensitivity.

Flux enhancement can be improved even further by careful choice of magnetic materials for the concentrator. Examples of such materials are metallic glasses with the following typical high permeability compositions of iron, cobalt, boron, phosphorous, nickel, molybdenum, carbon, silicon—Fe$_{80}$ B$_{20}$; Fe$_{81}$ Si$_{3.5}$ B$_{13.5}$ C$_2$; Fe$_{40}$ Ni$_{40}$ P$_{14}$ B$_6$; Fe$_{40}$ Ni$_{38}$ Mo$_4$ B$_{18}$; Fe$_{39}$ Ni$_{39}$ Mo$_4$ Si$_6$ B$_{12}$; Co$_{58}$ Ni$_{10}$ Fe$_5$ (Si$_1$ B)$_{27}$; Co$_{66}$ Fe$_4$ (Mo$_1$ Si$_1$ B)$_{30}$. Such glasses can be molded in a press to the required shape. Where the frequencies involved are high, laminated metallic glasses can be used: this is convenient as such materials are often supplied in ribbon form. Soft iron laminates or other high permeability materials can also be used.

With the materials now used, temperature sensitivity is much reduced as compared with the usually-used materials such as indium arsenide. Furthermore, susceptibility to noise is low, especially when using AC sampling with phase-sensitive detector techniques at different frequencies.

Figure 5:
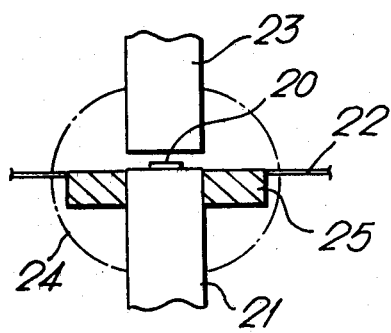
FIGS. 5 and 6 show another way to mount a device embodying the invention.
Figure 6:
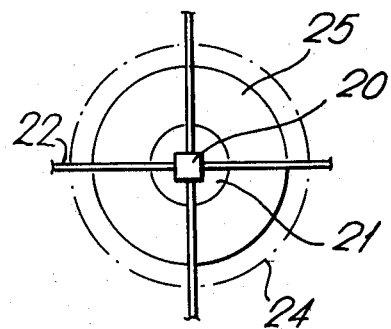

One arrangement for a device of the above type is shown in FIGS. 5 and 6, of which FIG. 5 is a diagrammatic side view and FIG. 6 a view from above. Here the Hall effect device 20 is formed on, or secured to, the end of a flux concentrator 21, with the lead 22 brought out as shown. Another flux concentrator 23 is placed over the device, so located as to give a very small air gap. The whole is then encapsulated in a potting compound as indicated at 24. The leads each end at a contact pad on a bush 25 of a non-magnetic and electrically insulating material (e.g. plastics).

Figure 7:
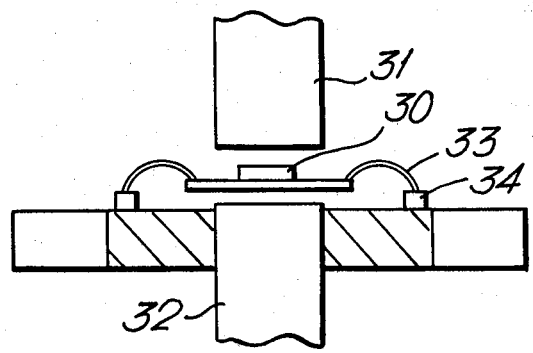
FIG. 7 shows schematically another way to mount a device embodying the invention.

In FIG. 7, which is to a larger scale than FIGS. 5 and 6, we see the Hall effect device 30 with its substrate between the flux concentrators 31, 32. The contacts are connected by flying leads such as 33 to terminals such as 34 from which the leads are taken out, only one such lead being shown. This also is encapsulated in a potting compound (not shown). In this arrangement, the leads can be taken out by suitable photolithographic design, so that the actual device 30, which may be a mesa (as shown) and the surrounding area can be thinned by etching. Thus the device 30 is isolated, but conductive tracks extend on the gallium arsenide to the surrounding region for connection as shown.

At this point it is worth mentioning that with the advanced signal processing techniques available, and the relatively low noise produced in a gallium arsenide device, it is possible in some applications to eliminate the use of flux concentrators. However, in such cases, the device can be mounted, and blobs of metallic glass placed above and below the device to increase sensitivity.

The main emphasis in the proceeding description has been on Hall effect devices made from gallium arsenide, but other materials can be used, one of which is silicon, possibly suitably doped. Thin silicon etching techniques can thus be used in the manufacture of such devices.

Figure 8:
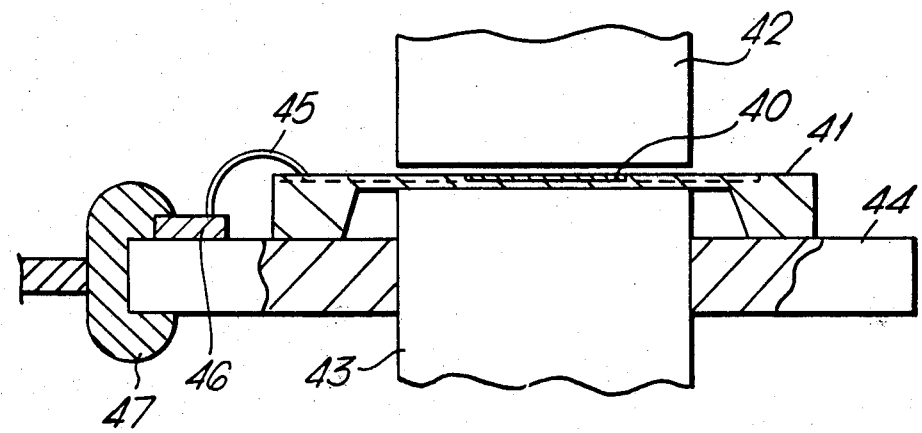
FIG. 8 shows a side view of another way to mount a device embodying the invention.
Figure 9:
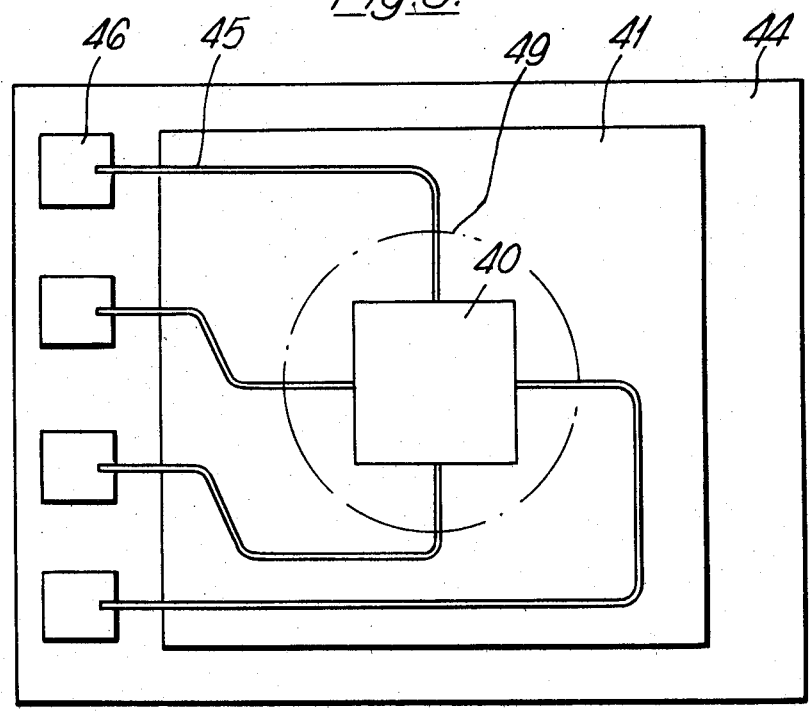
FIG. 9 shows a plan view of another way to mount a device embodying the invention.

FIGS. 8 and 9 show in side and plan views an application of a thin silicon Hall effect device 40, centered on a region 41 of thin silicon. This thin silicon region 41 is centered between the pole-pieces 42 and 43 of a magnet, and has downwardly-extending regions to a substrate 44 of alumina. The Hall electrodes are connected via bands such as 45 to pads such as 46, each connected to a contact pin via a solder blob 47. These bands are made by metallization. The dashed line circle 49 indicates a back-etch central region for the pole pieces.

The silicon used has a epilayer or ion implant on high resistivity substrate of reverse doping type. The pole pieces are of high permeability material, e.g. ma-metal or metallic glass.

Such devices with flux concentrators can be used to measure components of induction perpendicular to the plane of the Hall device. If two Hall voltages are placed in series, but perpendicular to each other in a horizontal position, then the sum of the Hall voltages is a sine voltage whose phase shifts from 0° to 360° with the angle between the Hall arrangement and the direction of magnetic north. Voltages can then be derived which are proportional to the angle between the Hall devices and north, so that we have a compass.

Three Hall devices can be set perpendicular to each other, with feed-back coils around the concentrators to reduce hysteria effects. In this case, care is needed to ensure that the flux concentrators in the three axes do not interfere with each other in terms of field perturbation. With the relatively small flux concentrators used, any such perturbations are reduced.

We claim:

1. A method of making an improved Hall-effect device assembly comprising:
   providing a substrate with an epitaxial layer, having Hall electrodes thereon, and an intervening barrier layer between said substrate and said epitaxial layer, wherein said barrier layer has a composition different from said epitaxial layer and said substrate;
   removing said substrate to form a Hall-effect device by dissolving said substrate with an etchant, wherein said etchant and said barrier layer are substantially non-reactive;
   mounting said Hall-effect device in a space provided by disposing the substantially planar ends of two flux concentrator rods in substantially parallel facing relationship;
   attaching leads in conducting relationship with said Hall-electrodes; and
   encapsulating said Hall-effect device and said ends of said rods in a body of potting compound with said Hall-effect device disposed in said space substantially parallel to said rod ends and said leads extending externally of said body of potting compound.

2. The method recited in claim 1 wherein:
   said epitaxial layer is gallium arsenide;
   said barrier layer is gallium aluminum arsenide having the formula $Ga_{1-x}Al_xAs$ where $0.8 > x > 0.5$; and
   said etchant comprises a mixture of a 30% aqueous solution of 95% $H_2O_2$ and a 5% concentrated $NH_3$ solution.

3. The method recited in claim 1 or 2 further including the step of removing said intervening barrier layer, using an etchant that is substantially non-reactive with said epitaxial layer, after removing said substrate.

4. The method recited in claim 3 wherein said etchant used to remove said intervening barrier layer is a concentrated HF solution.

5. The method recited in claim 1 or 2 further including the step of depositing said epitaxial layer by metalorganic chemical vapor deposition.

6. The method recited in claim 1 wherein said Hall-effect device is mounted to the substantially planar end of one of said rods prior to encapsulation in said potting compound.

7. The method recited in claim 6 wherein:
   said leads include a conductive pattern formed on the end of said one rod and lead extensions connected to said conductive pattern extending beyond the periphery of said one rod and externally of said body of potting compound; and
   said Hall-effect device is mounted with said Hall electrodes in contact with said conductive pattern to provide the current and sensing circuits for said Hall-effect device.

8. The method recited in claim 7 wherein said lead extensions are supported by a non-magnetic, electrically insulating material.

9. The method recited in claim 7 wherein said Hall-effect device is mounted on the end of said one rod prior to removing said substrate.

10. The method recited in claim 6 wherein:
    said Hall-effect device is mounted on a substantially planar platform; and
    said leads include a conductive pattern formed on the surface of said platform and lead extensions extending from said platform and externally of said body of potting compound, wherein said Hall-effect device is mounted on said platform with said Hall electrodes in contact with said conductive pattern to provide the current and sensing circuits for said Hall-effect device.

11. The method recited in claim 10 wherein said lead extensions include a supporting portion that cooperate with the end of said one rod to hold said platform in said space prior to encapsulation in said body of potting compound.

12. The method recited in claim 1, 2, 6, 7, 8, 9, 10 or 11 wherein:
    said Hall-effect device is substantially square with sides no longer than 0.5 mm and no thicker than 10 $\mu$m;
    said space is no greater than 0.3 mm; and
    said rods have a round cross-section no greater than 1.1 mm in diameter and are no greater than 20 mm long.

13. The method recited in claim 12 wherein:
    said Hall-effect device has sides about 0.5 mm long and is about 1 $\mu$m thick;
    said space is 10 $\mu$m; and
    said rods are 8 mm long and 0.5 mm in diameter.

14. The method recited in claim 1, 2, 6, 7, 8, 9, 10 or 11 wherein said rods are metallic-glass.

* * * * *